(12) United States Patent
Laurent-Michel (10) Patent No.: US 9,391,717 B2
(45) Date of Patent: Jul. 12, 2016

(54) METHOD AND SYSTEM FOR SIGNAL DYNAMIC RANGE IMPROVEMENT FOR FREQUENCY-DIVISION DUPLEX COMMUNICATION SYSTEMS

(71) Applicant: Stephane Laurent-Michel, Richmond Hill, CA (US)

(72) Inventor: Stephane Laurent-Michel, Richmond Hill, CA (US)

( * ) Notice: Subject to any disclaimer, the term of this patent is extended or adjusted under 35 U.S.C. 154(b) by 134 days.

(21) Appl. No.: 14/079,392

(22) Filed: Nov. 13, 2013

(65) Prior Publication Data

US 2014/0161005 A1    Jun. 12, 2014

Related U.S. Application Data

(60) Provisional application No. 61/725,953, filed on Nov. 13, 2012.

(51) Int. Cl.
| | |
|---|---|
| H04B 1/10 | (2006.01) |
| H04B 15/00 | (2006.01) |
| H04B 1/525 | (2015.01) |
| H04B 17/21 | (2015.01) |
| H04B 17/345 | (2015.01) |
| H04B 1/04 | (2006.01) |

(52) U.S. Cl.
CPC .............. *H04B 15/00* (2013.01); *H04B 1/525* (2013.01); *H04B 17/21* (2015.01); *H04B 17/345* (2015.01); *H04B 2001/0425* (2013.01)

(58) Field of Classification Search
CPC .......... H04B 1/10; H04B 1/109; H04B 1/126; H04B 1/525; H04B 15/00; H04L 1/005
See application file for complete search history.

(56) References Cited

U.S. PATENT DOCUMENTS

| | | | | |
|---|---|---|---|---|
| 7,088,793 | B1* | 8/2006 | Mickelson | H04L 1/005 375/229 |
| 7,809,349 | B1 | 10/2010 | Granger-Jones | |
| 8,331,509 | B2* | 12/2012 | Wang | H04B 1/126 327/551 |
| 8,358,170 | B2 | 1/2013 | Chen | |
| 8,422,974 | B2 | 4/2013 | Hahn | |
| 8,519,790 | B2 | 8/2013 | Chen | |
| 2004/0151238 | A1* | 8/2004 | Masenten | H04B 1/525 375/219 |
| 2010/0048146 | A1* | 2/2010 | McCallister | H04B 1/525 455/78 |
| 2011/0190028 | A1 | 8/2011 | Hahn | |
| 2011/0211649 | A1 | 9/2011 | Hahn | |
| 2011/0212692 | A1 | 9/2011 | Hahn | |
| 2011/0212696 | A1 | 9/2011 | Hahn | |
| 2011/0256857 | A1 | 10/2011 | Chen | |
| 2011/0299575 | A1* | 12/2011 | Aoulad Ali | H04B 1/10 375/219 |
| 2013/0149983 | A1 | 6/2013 | Fahim | |
| 2014/0036736 | A1* | 2/2014 | Wyville | H04B 1/109 370/278 |

\* cited by examiner

*Primary Examiner* — David B. Lugo (74) *Attorney, Agent, or Firm* — Trellis IP Law Group, PC (57) ABSTRACT

Canceling distortion in the receive path of a radio is achieved by down-converting an RF transmit signal to cancel leakage and intermodulation noise in a receive path baseband or intermediate frequency signal. Cancelation may be combined with digital pre-distortion of the transmit signal. Processing may be applied to optimize cancelation. Further cancelation can be achieved by re-modulating the demodulated and error-corrected receive signal, and predicting distortion caused by the transmit path. The cancelation system may be calibrated using a test signal.

16 Claims, 12 Drawing Sheets

METHOD AND SYSTEM FOR SIGNAL DYNAMIC RANGE IMPROVEMENT FOR FREQUENCY-DIVISION DUPLEX COMMUNICATION SYSTEMS

CROSS REFERENCES TO RELATED APPLICATIONS

This application claims priority from U.S. Provisional Patent Application Ser. No. 61/725,953, entitled "Method and System for Signal Dynamic Range Improvement for Frequency-Division Duplex Communication Systems", filed on Nov. 13, 2012, and it is related to the following applications: U.S. patent application Ser. No. 14/869,785, entitled "A Method For Calibrating Distortion Cancelation In Duplex Communication Systems", filed on Sep. 29, 2015, which is a divisional from the present application, and U.S. patent application Ser. No. 14/080,604, entitled "Method And System For Mitigating The Effects Of A Transmitted Blocker And Distortions Therefrom In A Radio Receiver" and filed on Nov. 14, 2013, and which are both hereby incorporated by reference, as if set forth in full in this specification.

BACKGROUND

Frequency-division duplex (FDD) and many other radio types include both a transmitter and receiver, often operating simultaneously on different frequency bands. Leakage and intermodulation (IM) effects can cause unwanted artifacts and noise from the transmitted signal to be introduced into the receiver signal path. This adds noise to the received signal, decreasing the dynamic range and sensitivity of the receiver, and reduces overall receiver performance.

Leakage of a transmit signal into the receive path generally causes two problems. The first is generation of new IM noise in any of the nonlinear devices in the receive path. Some of this will show up as in-band (i.e. within the receive band) noise, thereby worsening the signal-to-noise ratio and making it hard or impossible to receive signals from weaker, desired stations. The second problem is that the amplitude of a leaked transmit signal at an input of an analog-to-digital converter (ADC), even if its frequency doesn't overlap the desired receive signal, may be much stronger than the amplitude of that desired receive signal. To prevent clipping of the ADC, several (most significant) bits of resolution may need to be sacrificed, reducing the resolution with which the desired receive signal can be digitized, and increasing digitization noise.

One prior approach to reducing leakage and intermodulation noise is to include a guard band between the transmitter and receiver frequency bands. Most often, some noise will still leak past the guard band into the receiver frequency band. Increasing the guard band reduces the amount of leakage noise, but may waste overall bandwidth.

Figure 1A:
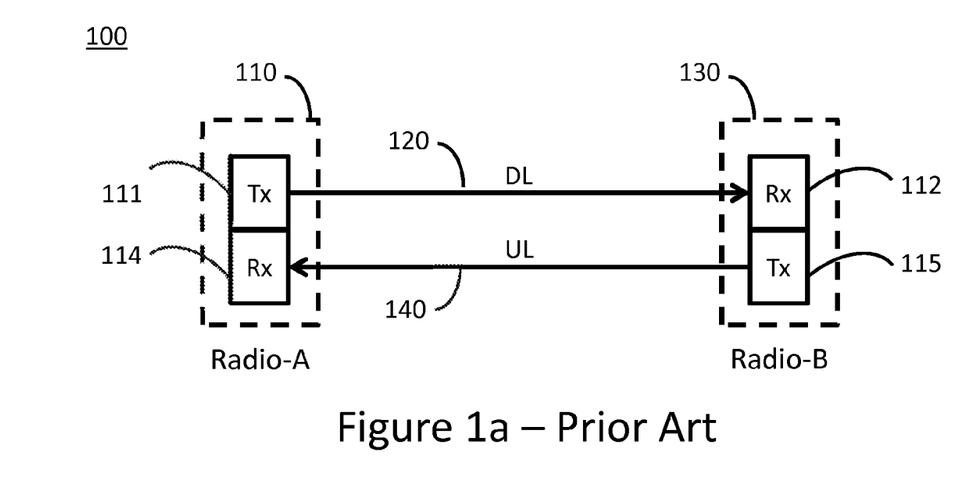
FIGS. 1a-1b illustrate a system in which two frequency-division duplex (FDD) radios communicate using an example frequency spectrum including a guard band.

FIG. 1a illustrates an example system 100 with two communicating frequency-division duplex (FDD) radios: Radio-A 110 and Radio-B 150. Each radio contains an associated transmitter 111, 115 and receiver 114, 112, respectively. In this example, the signal transmitted by Radio-A 110 and received by Radio-B 130 is called the downlink (DL) signal 120. Similarly, the signal transmitted by Radio-B 130 and received by Radio-A 110 is called the uplink (UL) signal 140. One illustrative context includes Radio-A 110 in a base station and Radio-B 130 in a mobile device such as a mobile phone.

Figure 1B:
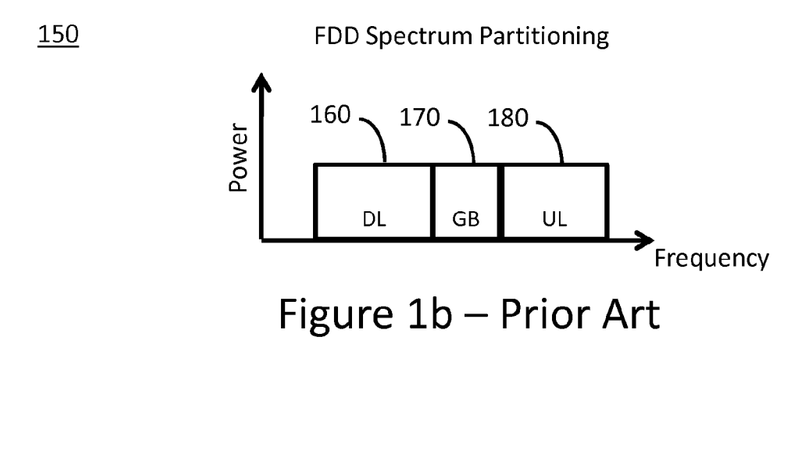

FIG. 1b illustrates an example frequency spectrum 150 in an FDD system such as drawn in FIG. 1a. The DL signal band 160 and UL signal band 180 occupy disjoint but not necessarily contiguous frequency bands. Generally, there is also an inactive or unused portion of the spectrum between the DL band 160 and UL band 180 called the guard band (GB) 170. Without loss of generality, FIG. 1b illustrates the DL band 160 as being lower in frequency than the UL band 180, but those skilled in the art understand that this need not be the case in general.

The problems caused by leakage and intermodulation are common in communication systems, whether using FDD and GBs or not. Examples include multi-user access methods, including but not limited to using time-division multiplexing (TDD) or Orthogonal Frequency Division Multiple Access (OFDMA), its derivatives such as Discrete Fourier Transform (DFT) pre-coded OFDMA or code-division multiple access (CDMA). Furthermore, in some systems, instance frequency bands may be fragmented, rather than show the simple spectrum stacking of FIG. 1b.

Communication systems may also use space division and diversity duplexing in combination with frequency division duplexing. Such systems are subject to large near-far effects that limit system performance by requiring a large dynamic range for signals in the receive path of the station. For instance, a base station, while transmitting its own powerful downlink to multiple mobile devices, may simultaneously receive a relatively strong signal from a nearby mobile device and a relatively weak signal from a far away mobile device.

While the problems caused by leakage and intermodulation may have a different scale in a base station than in a mobile device, they do not have a different nature. Therefore, this document will further describe FDD radios without distinction as to their place in the overall communication system.

Figure 3:
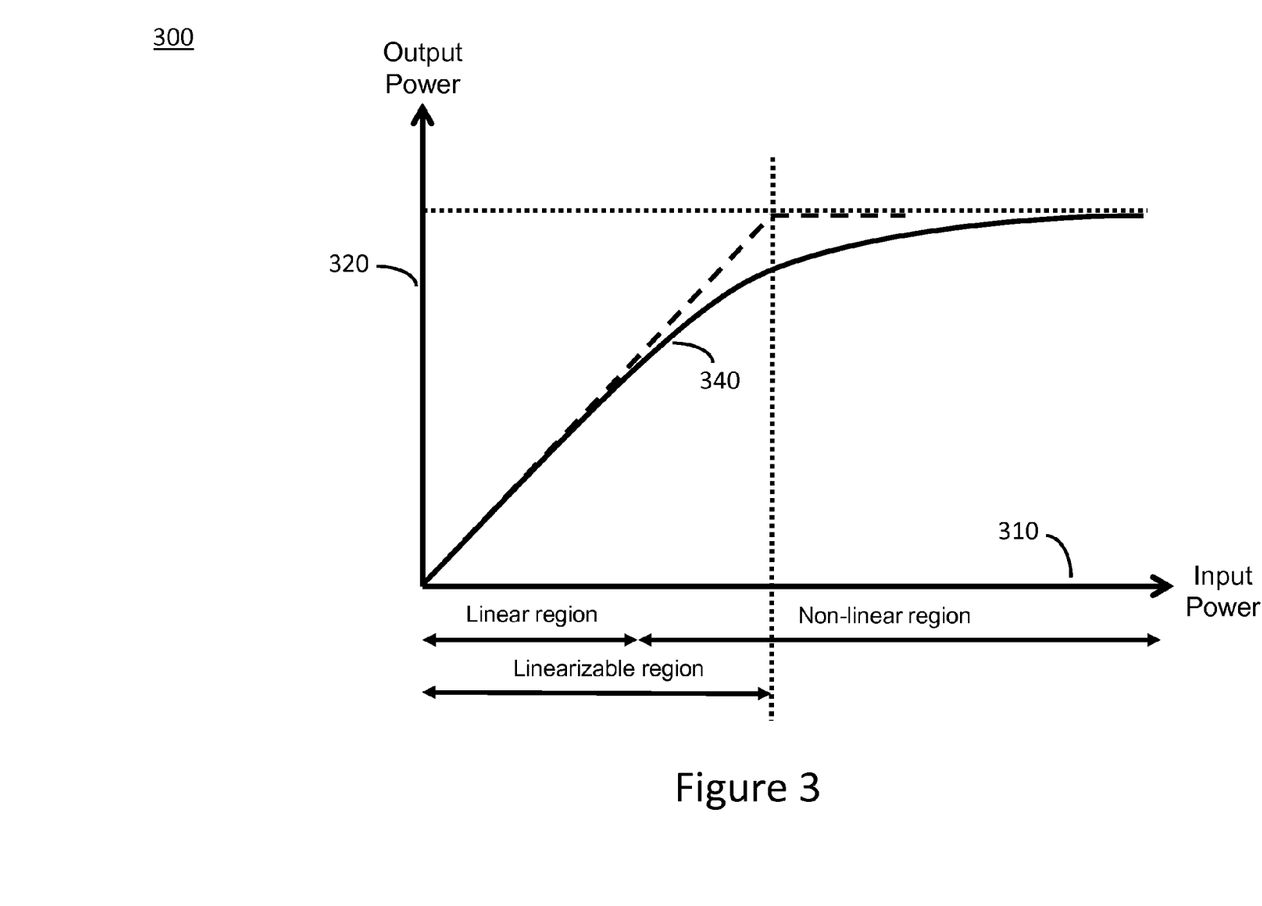
FIG. 3 illustrates a typically non-linear output power of a power amplifier.

A large source of distortion in the transmit path is the power amplifier. It is often operated in its nonlinear region in order to improve the power transfer efficiency of the system. FIG. 3 shows an example power transfer diagram 300 plotting the output power 320 of a power amplifier versus its input power 310. The power amplifier is characterized by curve 340 which is linear for a limited region of operation. When the power amplifier is operated beyond its linear region, peak power is not delivered as needed, and the resulting waveform distortions show up as third and higher order effects in the frequency spectrum, leaking outside the desired frequency band of the transmit signal.

There is an unmet need to reduce the presence of noise caused by a transmit signal and other sources at all stages of the receive path.

SUMMARY

Embodiments of the invention reduce the impact of leakage and intermodulation noise, and thereby improve the dynamic range in a radio.

An embodiment of the invention includes a method for canceling noise in the receive path of a radio, comprising: forwarding an RF transmit signal from a location of a transmit path of the radio to a down-converting mixer; down-converting the forwarded RF transmit signal; forwarding the down-converted transmit signal to the receive path of the frequency-division duplex radio; and canceling at least a portion of the noise in a signal in the receive path using the down-converted transmit signal to create a noise-reduced receive path signal.

An embodiment of the method may further comprise digitizing the down-converted transmit signal, and performing the cancelation in the digital domain, forwarding the digitized down-converted transmit signal to a digital pre-distortion system, and/or processing the down-converted transmit signal to improve the cancelation.

Another embodiment of the invention includes a noise cancelation radio system, comprising: a first down-converting mixer, having a first input coupled with a location in a transmit path carrying an RF transmit signal, a second input coupled with a local oscillator, and an output; and a cancelation module in a receive path of the radio system, having a first input coupled with an output of a first down-converting mixer, a second input coupled with the output of the second down-converting mixer, and an output coupled to a baseband receive module.

BRIEF DESCRIPTION OF THE DRAWINGS

The invention will be described with reference to the drawings, in which.

DETAILED DESCRIPTION OF EMBODIMENTS

To combat the problems described above, embodiments of the invention may offer a way of reducing distortions by one or more of the following:

(1) effectively filtering the out-of-band signals in the receive path to reduce the source of further intermodulation (IM) noise, and to enhance the effective dynamic range of the analog-to-digital converter;

(2) actively canceling the in-band noise (and possible remaining out-of-band noise) in the receive path; and (3) actively canceling IM noise stemming from external sources such as neighboring antenna elements, for instance as used in active antenna systems.

These embodiments provide advantages including:

(a) Easing requirements for a transmit linearization system or adjacent channel leakage ratio requirements, since the receive path is less sensitive;

(b) The feedback signal of a digital pre-distortion (DPD) system can be reused;

(c) Simplified filtering requirements for the radio's duplexer;

(d) The receive path is less sensitive to blocking effects from the transmit channel;

(e) Transmit co-channel interference is improved because the interferences generated by the power amplifier in the receive duplex band are canceled;

(f) The power amplifier can be used more efficiently because larger distortion on the receive duplex can be tolerated, while reducing the complexity of analog or digital pre-distortion;

(g) Multiband multimode transmit pre-distortion systems can generate receive path IM noise that previously could only be handled by filtering;

(h) Due to its digital nature, DPD inherently generates a spur. Spur cancelation can be handled in the receive path;

(i) Digital-only compensation does not degrade performance, since no devices are added in the sensitive analog or RF signal path;

(j) Distortion cancelation inherently enables distortion detection. It also enables the radio system to report on the receive conditions in the radio. An automated passive IM (PIM) noise detection mechanism can provide great value to network operators, enabling early problem detection, localization of the detection, and immunity to the problem. User call quality experience in the affected cell can be maintained, possibly without urgently fixing the source of PIM.

Figure 2:
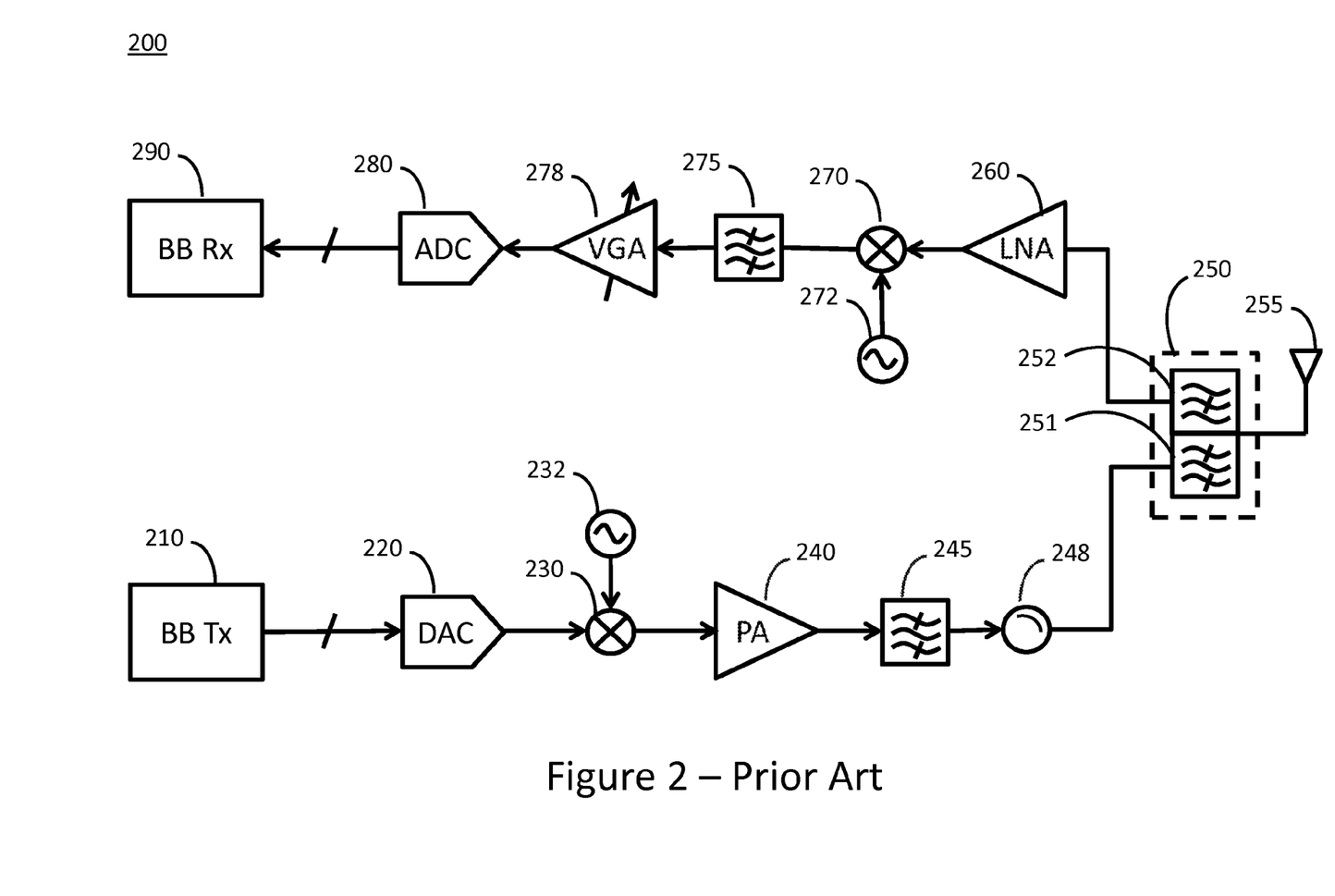
FIG. 2 shows a conventional FDD radio.

FIG. 2 shows a conventional FDD radio 200 in its basic form. The configuration is applicable to many communication systems, using many different kinds of modulation. Without loss of generality, it is assumed that the data to be transmitted is digital or digitized and modulated in a baseband transmit (BB Tx) module 210. Its digital output signal may be in the baseband, or at an (often low) intermediate frequency (IF). Its output signal is forwarded to a digital-to-analog converter (DAC) 220 which converts the digital signal into an analog baseband or IF waveform. The output of DAC 220 is then modulated up in frequency or up-converted by an up-converting mixer 230. The up-converting mixer 230 modulates the baseband output of DAC 220 up to the required transmit frequency as set by the local oscillator 232. The radio-frequency (RF) output of the up-converting mixer 230 is amplified by one or more amplifiers including a dedicated power amplifier (PA) 240. The PA output is forwarded to portion 251 of duplexer 250. The PA output may optionally be filtered by filter 245 and forwarded from filter 245 via circulator 248 to portion 251 of duplexer 250.

A circulator, although optional, is typically used to protect the amplifier for returning energy, such as when the antenna would be disconnected. A three-port circulator of which one port is attached to the output of a power amplifier, another port is terminated with a matched load, and the third port is connected to an antenna system, acts as an isolator, allowing the signal from the power amplifier to only travel out, independently of correct termination by the antenna system. The duplexer 250 serves to connect both the transmitter portion and the receiver portion of the radio 200 to the antenna 255, while separating the receive and transmit signal paths.

The antenna 255 radiates the transmit signal electromagnetically to another radio.

In the example of FIG. 2, the receiver portion of radio 200 works in a similar manner. In particular, antenna 255 receives a radio signal in the receive band and filters that with a filter 252 in the duplexer 250. Filter 252 in the duplexer 250 serves to attenuate signal components outside the receive band while preserving the strength of the signal within the receive band. The output of filter 252 in the duplexer 250 is fed to a low-noise amplifier (LNA) 260 to amplify the signal. The output of LNA 260 is down-converted from the receive band to the baseband or intermediate frequency by the down-converting mixer 270 where the amount of frequency down-conversion is controlled by the frequency of the local oscillator 272. The IF or baseband signal output by the down-converting mixer 270 is separated from signals received at undesired frequencies by filter 275. In case the signal is down-converted to the baseband or a low intermediate frequency, filter 275 is typically a low-pass filter. If the signal is down-converted to a higher intermediate frequency, filter 275 is typically a band-pass filter. A variable-gain amplifier (VGA) 278 scales the received and filtered signal such that its maximum amplitude is suitable for the dynamic range of analog-to-digital converter (ADC) 280, which quantizes the signal to form a digital representation of the baseband or IF signal suitable for demodulation and further processing by the baseband receiver (BB Rx) module 290.

Imperfect isolation in the duplexer filters 251, 252 and nonlinear characteristics of various radio components, including but not limited to the up-converting mixer 230, power amplifier 240, duplexer 250, antenna 255, LNA 260, down-converting mixer 270, filter 275, VGA 278, and ADC 280, can lead to the transmitted signal corrupting or reducing the signal fidelity of the received signal. Some of these impairments will be described with the aid of FIGS. 4-8 illustrating distortion affecting the signal spectrum at various points in the signal path.

Many modulation techniques make use of quadrature modulation, where one part of the data is transmitted on an in-phase (I) RF carrier, and another part of the data is transmitted on a quadrature (Q) RF carrier.

Without loss of generality, all aspects of the invention are applicable to radios for quadrature or other modulation systems.

Figure 4:
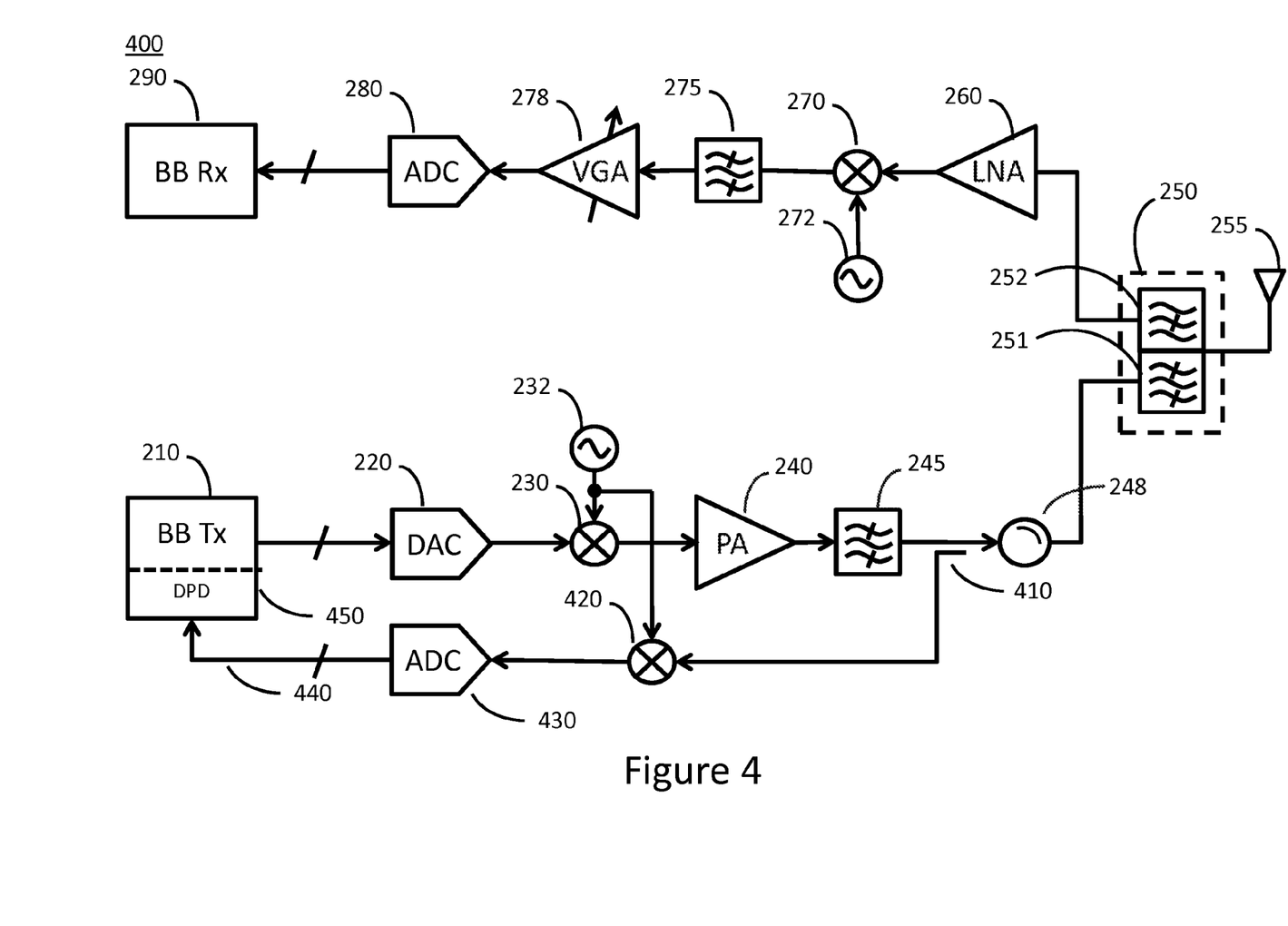
FIG. 4 illustrates an example system with digital pre-distortion (DPD) to linearize the output of the power amplifier according to an embodiment of the invention.

FIG. 4 illustrates an example radio 400 including digital pre-distortion (DPD) to linearize the output of the power amplifier according to an embodiment of the invention.

The DPD technique observes the output of the power amplifier 240 with a sensor 410 and down-converts the sensed power amplifier output signal with down-mixer 420, which may be controlled with the same local oscillator 232 as the up-converting mixer 230. The output of the DPD down-mixer 420 is sampled with analog-to-digital converter 430 to digitize the down-converted power amplifier output signal. The digitized signal 440 is fed into the DPD block 450 which can be part of baseband transmitter 210. The DPD block 450 introduces pre-distortion components into the baseband transmitter output so that the overall output signal of the power amplifier 240 has improved linearity. In an embodiment of the invention, down-mixer 420 includes a band-stop or bandpass mixer such as described in US patent application 2013/0149983.

Figure 5:
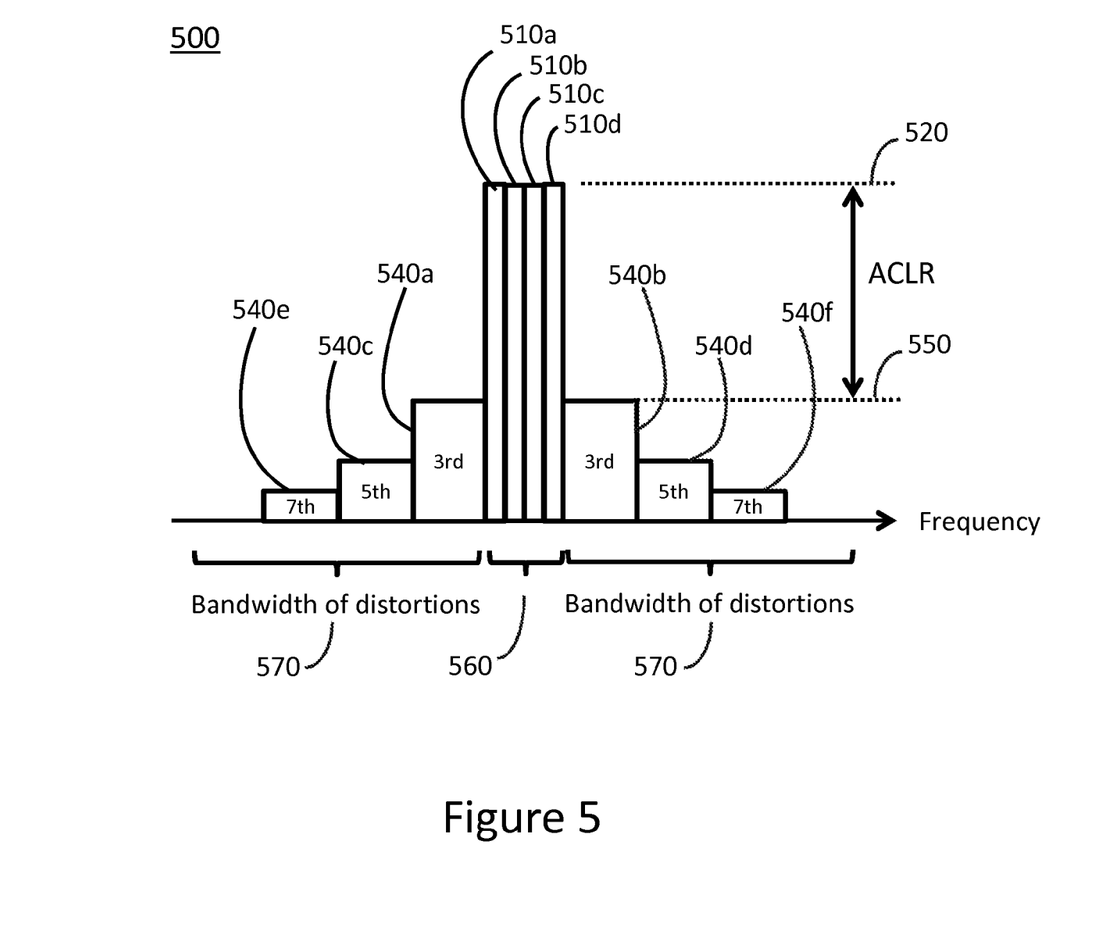
FIG. 5 illustrates an example antenna transmit signal spectrum without linearization.

FIG. 5 illustrates an example antenna transmit signal spectrum 500 without linearization. The example transmit (Tx) signal band 560 contains a plurality (four are drawn but there may be more or fewer) of channels 510a-d carrying data at a prescribed transmit power level 520. Due to system component nonlinearities, IM noise 540 is introduced as an artifact of the transmitted channels 510. The third order IM noise 540a and 540b are closest in frequency to the Tx band 260, followed by the fifth order noise IM products 540c and 540d, then the seventh order IM noise 540e and 540f, and so on.

The receive (Rx) signal will often overlap with the frequency of one or more of these IM noise bands, and hence, the Rx signal is subject to being distorted by these IM noise. For that reason, communications standards such as CDMA, GSM, or LTE will specify a minimum adjacent channel leakage ratio (ACLR) defining the ratio of the power 520 of the intended transmit signal to the maximum power 550 from any of the IM noise bands 540 to limit the amount of receive signal distortion.

Third and higher order IM noise bands widen the bandwidth of the transmit signal. For example, although the desired transmit signal occupies only frequency band 560, IM noise increases the radiated energy bandwidth to include the sidebands 570 on both sides of band 560.

Figure 6:
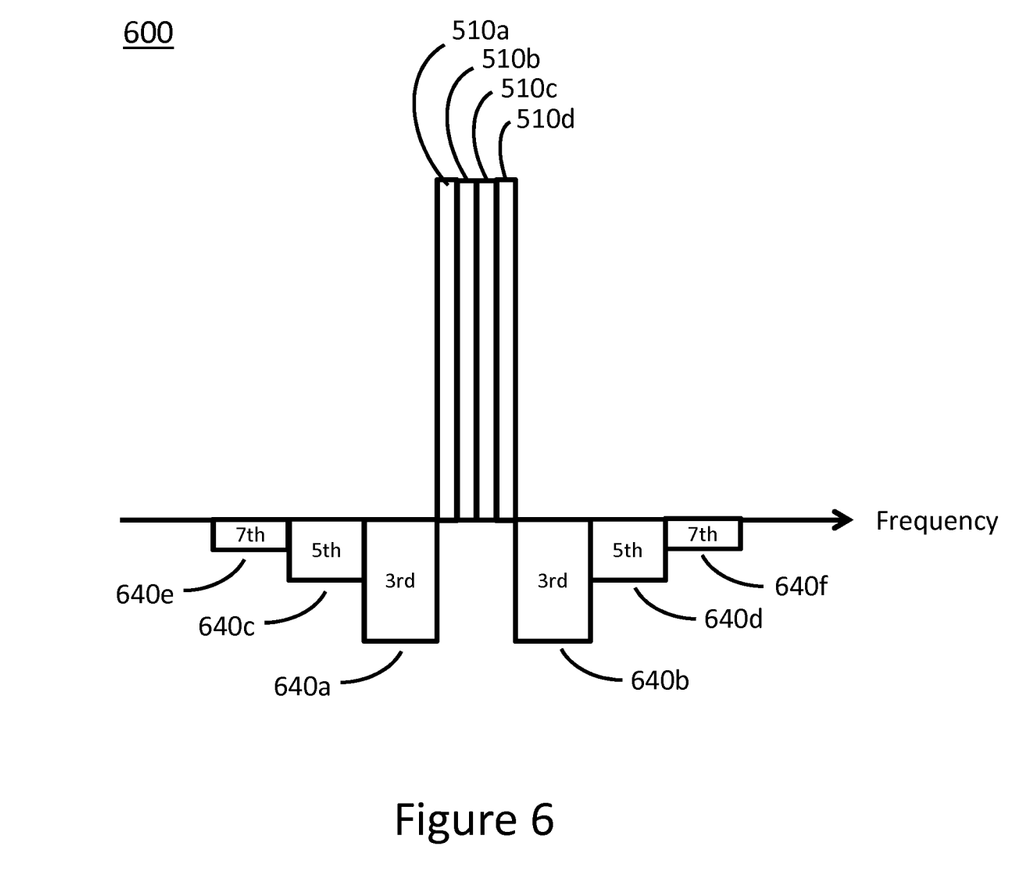
FIG. 6 shows an example spectrum at the input of the power amplifier when DPD is used.

FIG. 6 shows an example spectrum 600 at the input of power amplifier 240 when DPD is used. The desired channels 510a-510d are at their normal level. However, the inverse noise bands 640a-640f are added to cancel the respective third, fifth, seventh, and so on, IM noise bands that will occur in the power amplifier 240.

Figure 7:
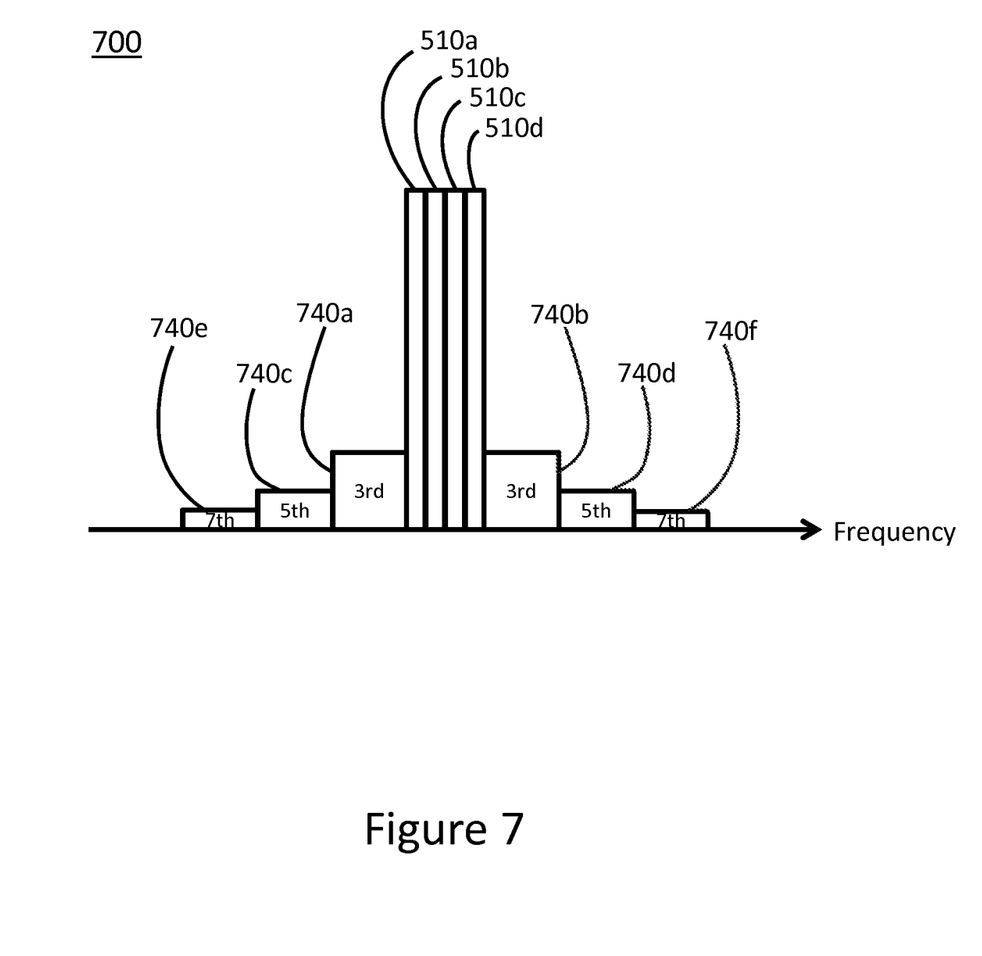
FIG. 7 shows the resulting antenna transmit spectrum when applying pre-distortion.

FIG. 7 shows the resulting antenna transmit spectrum 700 when applying digital pre-distortion. Due to imperfect cancelation of the IM noise, but often also due to nonlinearities occurring after DPD sensor 410, there are still third and higher order IM products 740a-740f in the antenna signal. However, compared to the spectrum 500 without distortion cancelation, leakage into adjacent channels is considerably reduced.

Figure 8:
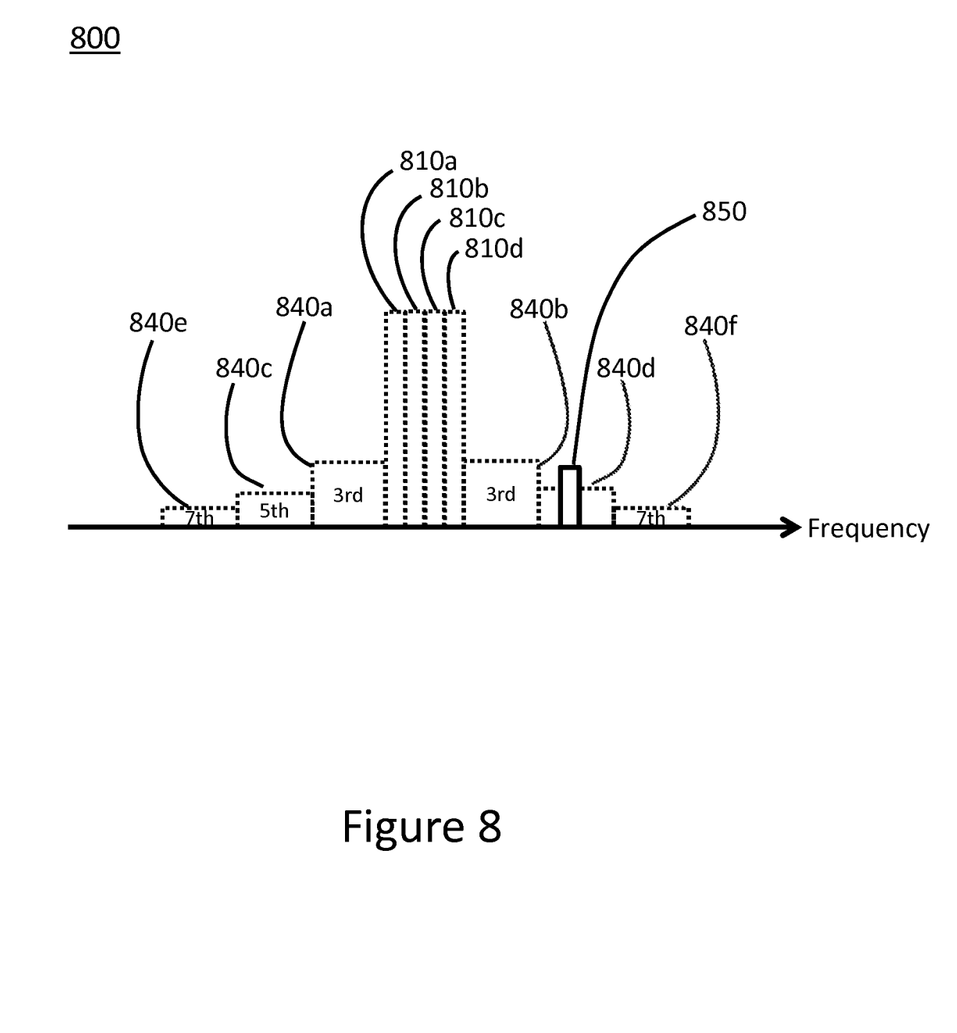
FIG. 8 shows an example of a typical signal spectrum in the receive path of an FDD radio.

FIG. 8 shows an example of a typical signal spectrum 800 in the receive path of an FDD radio. The desired signal has been drawn in FIG. 8 with a continuous outline, whereas the undesired leakage and distortion noise have been drawn with dotted lines. The Rx signal 850 occupies a different frequency band than the Tx signal 510 or 810. However, due to leakage and IM noise via the antenna path and otherwise, the amount of energy 810a-810d of the Tx signal in the receive path may be considerably stronger than the energy of the Rx signal 850. Even worse, the amounts of energy 840a-840f of the IM products are disproportionally high since they do not only include leaked energy, but also additional IM noise generated by the leaked Tx signal 810 in the receive path itself. Since the IM noise may overlap the frequency band of the desired Rx signal 850, its quality can be severely affected. Far away stations may not be properly received as their signals drown in the noise from IM noise.

FIG. 8 further illustrates a problem for receive path ADC 280, which needs to be able to digitize the maximum values of the analog signal at its input. The maximum value is due to the leaked transmit signal 810, reducing the dynamic range available for the receive signal 850. The dynamic range of an ADC is costly in terms of material (for instance, silicon area) and power. Therefore it is generally required to use the dynamic range of an ADC as efficiently as possible, in other words the receive signal 850 should be the strongest signal at its input and it should be scaled by variable gain amplifier 278 to occupy as much of the ADC's dynamic range as possible. The strong leakage signal 810 of the Tx signal prevents this, thereby adding quantization noise and further degrading the quality of the resulting signal at the input of the baseband module 290.

To effectively filter the out-of-band noise, embodiments of the invention can use a bandpass filter or bandpass mixer, as referenced above, which allows very narrowband filtering at RF frequencies. If mixer 270 is a bandpass mixer, it may provide a frequency-dependent input impedance that can be exploited by the LNA 260 to sharply reduce adjacent-channel signals and intermodulation noise products.

Figure 9:
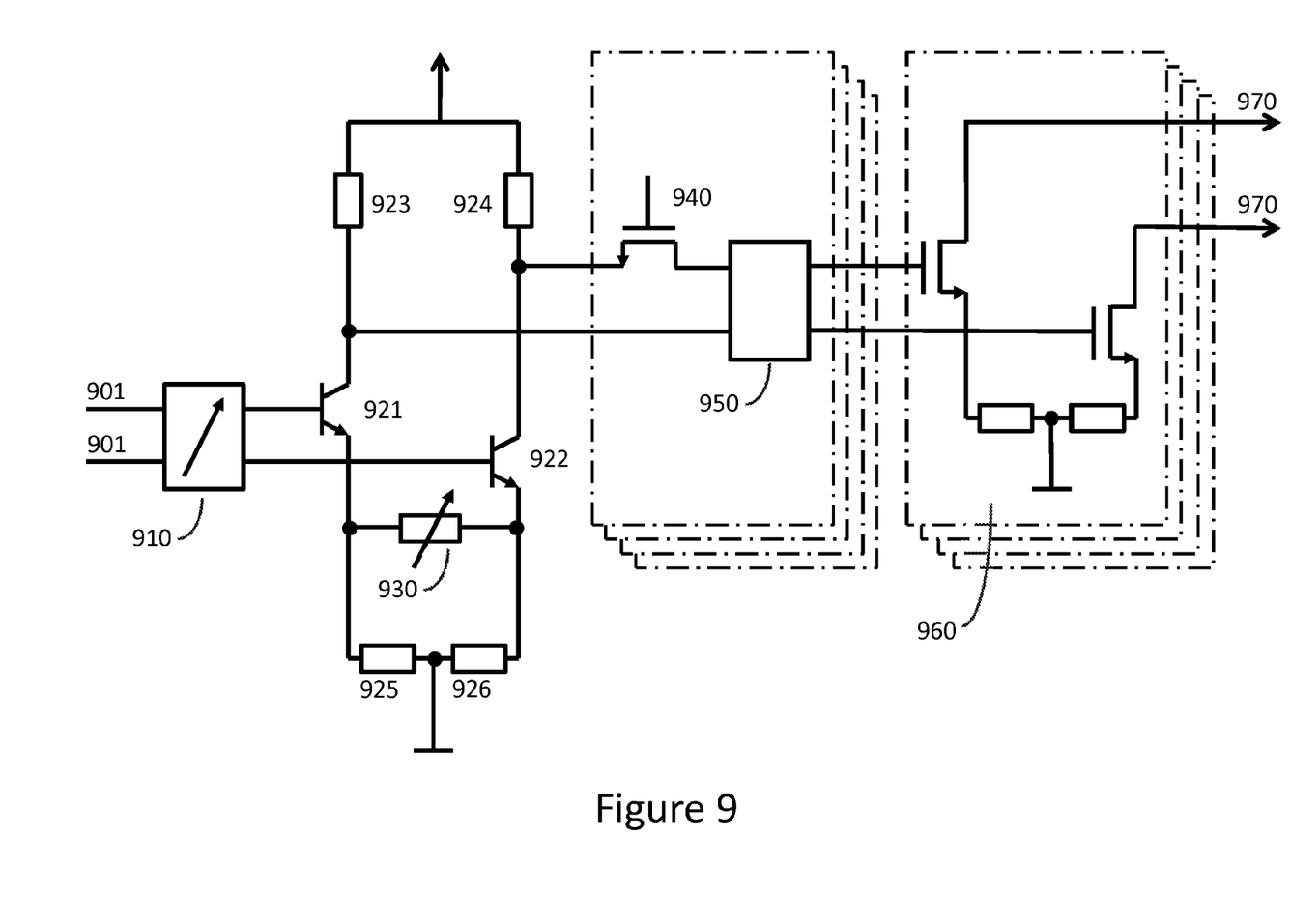
FIG. 9 shows a circuit for filtering some of the leakage components out of the radio-frequency signal in the receive path.

FIG. 9 shows a circuit for filtering some of the leakage and IM noise out of the radio-frequency signal in the receive path. The circuit illustrates a realization of the interface between LNA 260 and bandpass mixer 270. Differential RF input signals 901 pass through front attenuator 910 into the amplifier stage formed by transistors 921 and 922. The maximum achievable gain of this stage is determined by the ratio of collector elements 923 and 924 versus emitter elements 925 and 926. These elements can be resistors, or frequency-dependent networks. However, because of the presence of load degeneration attenuator 930, the actual gain may be lower. The settings of front attenuator 910 and load degeneration attenuator 930 are determined by adjustable gain control circuits as customary in radio receivers. They serve to optimize the dynamic range of the LNA and the bandpass mixer. In a conventional mixer, the input impedance of the input stage 960 of the mixer could be high and frequency-independent, such that the spectrum of signals 970 after the input stage would closely resemble the spectrum of signals as measured between the LNA output elements 923 and 924. However, due to a feedback loop (not shown in FIG. 9) in the bandpass mixer, signals in the pass band can pass uncompromised, whereas signals in adjacent channels can be effectively short-circuited. Pass transistor 940 and filter 950 can further assist to shape the spectrum optimally, wherein filter 950 includes an RC network.

The technique described here works much more efficiently than tunable resonators, such as based on inductors, or LC duplexers, ceramic duplexers, or air cavity duplexers. Using the technique will greatly reduce the out-of-band signals, most importantly the leakage components 810 of the Tx signal, thus reducing further self-intermodulation and enhancing the effective dynamic range at the analog-to-digital converter 280.

Figure 10:
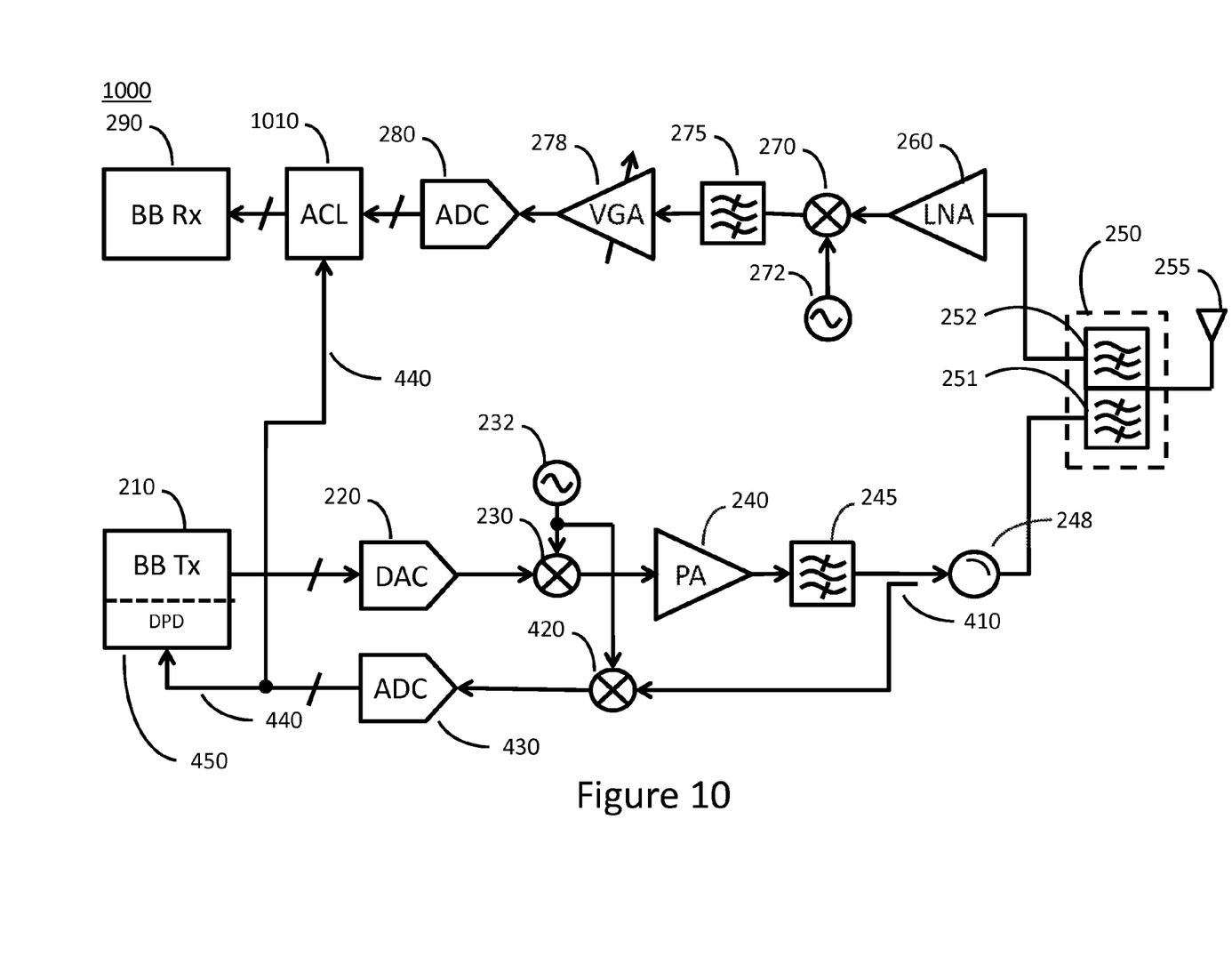
FIG. 10 illustrates an example radio including a digital pre-distortion system for cancelation of noise in the receive path according to an embodiment of the invention.

FIG. 10 illustrates an example radio 1000 including a digital pre-distortion system for cancelation of noise in the receive path according to an embodiment of the invention. This technique allows for actively canceling the in-band distortion and potentially any remaining out-of-band noise. In this example 1000, cancelation is performed in adjacent channel leakage (ACL) canceler block 1010. In an embodiment, the ACL block 1010 operates in the digital domain (e.g. following ADC 280), but alternative embodiments of the ACL block 1010 may operate in the analog domain (e.g. preceding ADC 280). In such analog domain embodiments, the input signal for the ACL 1010 may not be provided by the output 440 of ADC 430, but for example by a signal at the input of ADC 430.

Signal 440 serves as a baseband (or IF) representation of the output signal of power amplifier 240, as sensed at location 410. It has been down-converted by mixer 420 and digitized by ADC 430.

In an embodiment, mixer 420 may be any type of mixer known in the art, including a band-stop mixer as described above, to sharply suppress the transmit path leakage noise, such as Tx signals 510a-510d from the transmit band 560.

In a further embodiment, a VGA or scaler (not shown) may be inserted between mixer 420 and ADC 430 to correct the dynamic range for the ADC 430.

In still further embodiments, ACL canceler block 1010 may further improve its cancelation by use of well-known techniques, including frequency decomposition, modification of the least mean squares (LMS) DPD optimization cost function, gain estimation, and other nested optimization loops.

Figure 11:
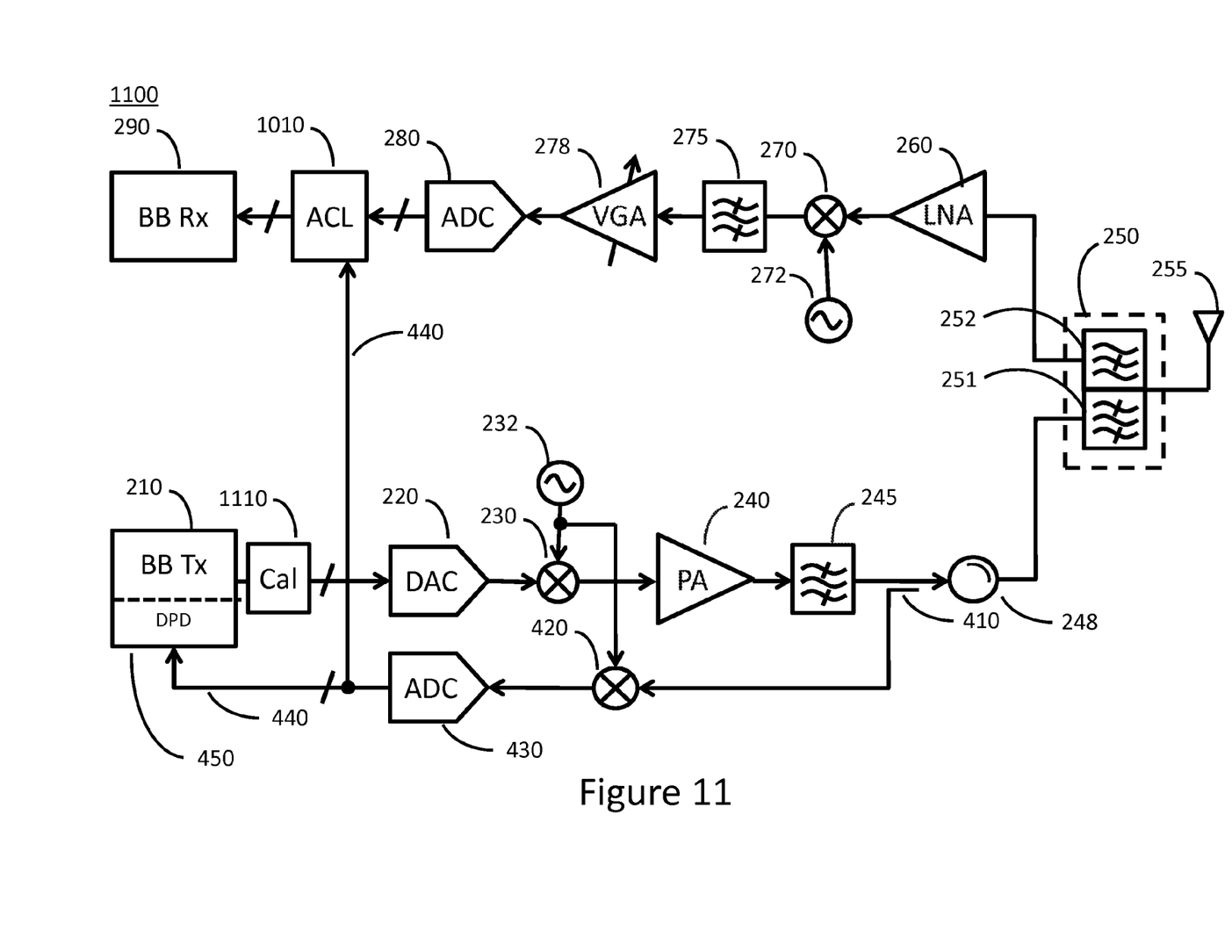
FIG. 11 illustrates the insertion of a test signal to calibrate the distortion cancelation system according to an embodiment of the invention.

FIG. 11 illustrates the insertion of a test signal to calibrate the distortion cancelation system according to an embodiment 1100 of the invention.

When calibration is performed, the ACL canceler 1010 measures the magnitude and phase characteristics of the chain formed by the transmit path, the duplexer, and the receive path. These system characteristics do not change with signal or operating conditions, and therefore the calibration can be done at power-up or at the time of field installation, and stored locally, e.g. in non-volatile or other memory. Insertion of the calibration signal can be at location 1110, as shown, or it may be performed as an integral function of the BB Tx module 210. The actual cancelation can subsequently be performed by ACL blocker 1010 applying the inverse system characteristics on signal 440 at the output of ADC 430.

Figure 12:
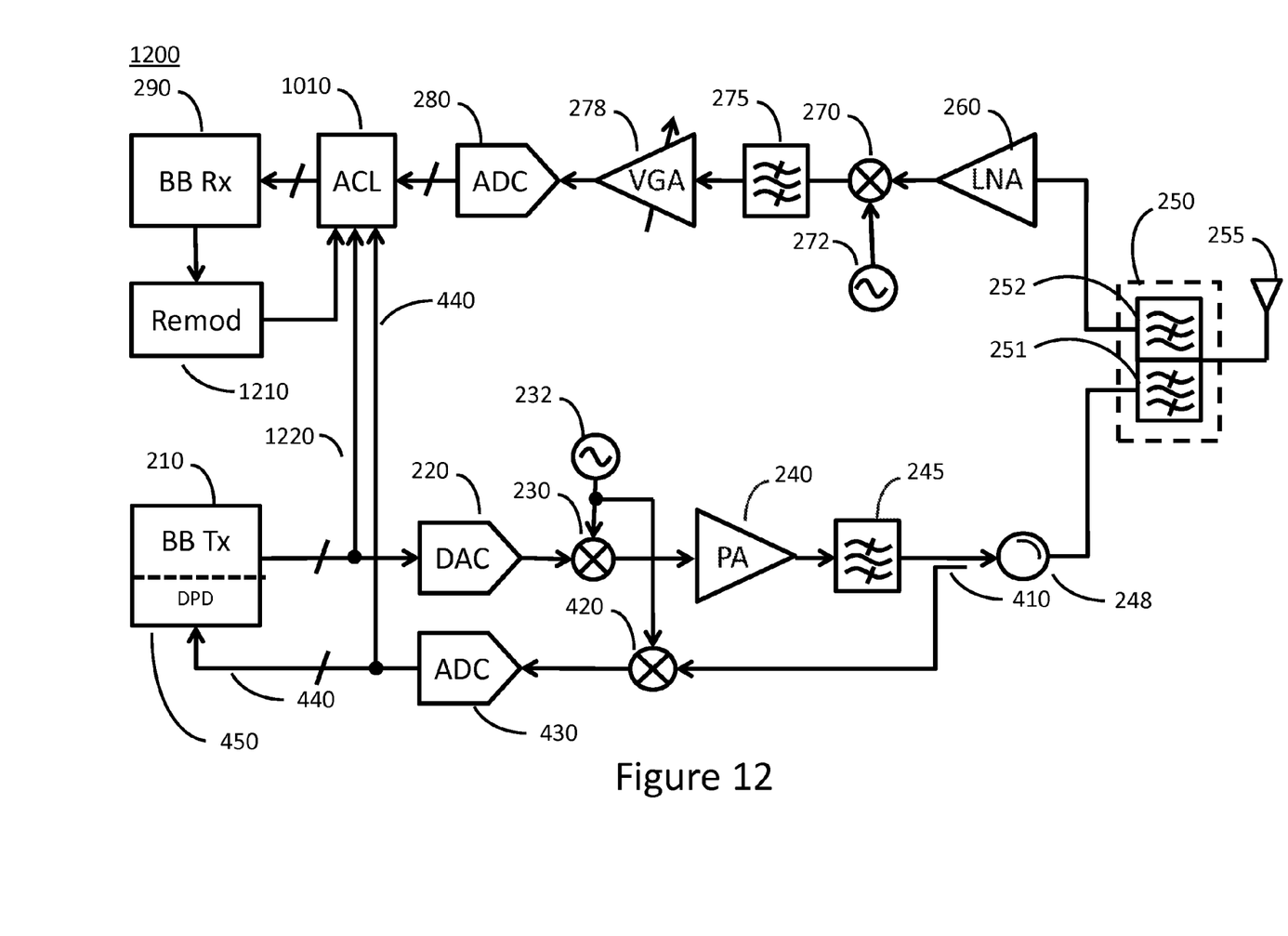
FIG. 12 shows an embodiment of the invention incorporating a feedback loop in the receive path.

FIG. 12 illustrates an example radio 1200 that estimates and cancels passive intermodulation (PIM) noise according to an embodiment of the invention. PIM noise is usually due to degradation of connectors and poor installation of the antenna, or the presence of metal in the antenna magnetic flux—which may introduce magnetic hysteresis. PIM noise is usually nonlinear, with little memory effect, and time-varying.

Block 290 demodulates the signal delivered by ACL canceler 1010. Error detection and forward error correction (FEC) data included in the demodulated signal is used to reconstruct a corrected receive signal. Normally, the radio outputs the corrected receive signal for use by a connected system or user. However, an embodiment of the invention also uses this corrected receive signal to improve the receive performance. In this embodiment, the corrected receive signal is provided to re-modulator 1210, which may also up-convert it in case of the signal being at an intermediate frequency, and provides the result to the ACL canceler 1010 that subtracts it from the digitized receive signal. The PIM noise at this point can be estimated and predicted using a PIM model convergence algorithm based on minimization of the error signal, minus a self-PIM model created from known Tx signal 1220. In an embodiment, cancelation of self-PIM can only be enabled when PIM is detected. PIM detection can be performed at regular intervals or as decided for network maintenance. Presence of PIM is determined by applying an error threshold in the PIM estimation process.

Although the description has been described with respect to particular embodiments thereof, these particular embodiments are merely illustrative, and not restrictive. Embodiments of the invention may be utilized in conjunction with any type of data encoding and/or modulation scheme known in the art.

Embodiments of the invention may be implemented using dedicated hardware and/or software executing on a general purpose computer processor, digital signal processor, stream processing system, application specific integrated circuit (ASIC) or any other type of hardware capable of executing one or more software programs. If software is used to implement any portion of an embodiment of the invention, any suitable programming language can be used to implement the routines of particular embodiments including C, C++, Java, assembly language, etc. Different programming techniques can be employed such as procedural or object oriented. The routines can execute on a single processing device or multiple processors. Although the steps, operations, or computations may be presented in a specific order, this order may be changed in different particular embodiments. In some particular embodiments, multiple steps shown as sequential in this specification can be performed at the same time.

Particular embodiments may be implemented in a computer-readable storage medium for use by or in connection with the instruction execution system, apparatus, system, or device. Particular embodiments can be implemented in the form of control logic in software or hardware or a combination of both. The control logic, when executed by one or more processors, may be operable to perform that which is described in particular embodiments.

Particular embodiments may be implemented by using a programmed general-purpose digital computer, by using application-specific integrated circuits, programmable logic devices, field programmable gate arrays, etc. Optical, chemical, biological, quantum or nano-engineered systems, components and mechanisms may be used. In general, the functions of particular embodiments can be achieved by any means as is known in the art. Distributed, networked systems, components, and/or circuits can be used. Communication, or transfer, of data may be wired, wireless, or by any other means.

It will also be appreciated that one or more of the elements depicted in the drawings/figures can also be implemented in a more separated or integrated manner, or even removed or rendered as inoperable in certain cases, as is useful in accordance with a particular application. It is also within the spirit and scope to implement a program or code that can be stored in a machine-readable medium to permit a computer to perform any of the methods described above.

As used in the description herein and throughout the claims that follow, "a", "an", and "the" includes plural references unless the context clearly dictates otherwise. Also, as used in the description herein and throughout the claims that follow, the meaning of "in" includes "in" and "on" unless the context clearly dictates otherwise.

Thus, while particular embodiments have been described herein, latitudes of modification, various changes, and substitutions are intended in the foregoing disclosures, and it will be appreciated that in some instances some features of particular embodiments will be employed without a corresponding use of other features without departing from the scope and spirit as set forth. Therefore, many modifications may be made to adapt a particular situation or material to the essential scope and spirit.

The invention claimed is:

1. A method for canceling intermodulation noise in a radio receive path, the method comprising:
    filtering an out-of-band signal in the radio receive path by providing a bandpass load of a low-noise amplifier (LNA) output and a bandpass mixer, wherein the bandpass load includes an RC network coupled with differential transconductance inputs of the bandpass mixer;
    forwarding an RF transmit signal from a source between a power amplifier output and an antenna in a radio transmit path to a down-converting mixer;
    in the down-converting mixer, down-converting the forwarded RF transmit signal;
    forwarding the down-converted transmit signal to the radio receive path;
    forwarding an intermodulation signal from a neighboring active antenna system antenna element to the radio receive path; and
    actively canceling at least a portion of the intermodulation noise included in a receive path signal using the down-converted transmit signal and the forwarded active antenna system intermodulation signal to create an intermodulation-reduced receive path signal.

2. The method of claim 1, further comprising digitizing the down-converted transmit signal, and wherein cancelation is performed in the digital domain.

3. The method of claim 2, further comprising forwarding the digitized down-converted transmit signal to a digital pre-distortion system.

4. The method of claim 1, wherein down-converting is performed by a band-stop or bandpass mixer.

5. The method of claim 1, further comprising processing the down-converted transmit signal to cancel at least an additional portion of the intermodulation noise included in the receive path signal.

6. The method of claim 5, wherein the processing includes frequency decomposition.

7. The method of claim 5, wherein the processing includes:
    forwarding the digitized down-converted transmit signal to a digital pre-distortion system; and
    modifying an LMS digital pre-distortion optimization cost function using the digitized down-converted transmit signal.

8. The method of claim 5, wherein the processing includes gain estimation.

9. The method of claim 5, wherein the processing includes nested optimization loops.

10. The method of claim 5, further comprising:
    demodulating the intermodulation-reduced receive path signal;
    detecting data errors in the demodulated receive path signal;
    correcting the data errors to generate a data-error-corrected signal;
    re-modulating the data-error-corrected signal;
    comparing the re-modulated signal with the intermodulation-reduced receive path signal to measure a receive path signal error;
    estimating distortion in the receive path signal based on the receive path signal error; and
    canceling at least a third portion of the intermodulation noise in the receive path signal using the estimated distortion.

11. The method of claim 10, further comprising up-converting the re-modulated signal prior to comparing it with the intermodulation-reduced receive path signal.

12. An intermodulation cancelation radio system, comprising:
    a low-noise amplifier with an output coupled with a bandpass load, wherein the bandpass load includes an RC network;
    a receive path bandpass mixer with differential transconductance inputs, the differential transconductance inputs being coupled with the bandpass load, and wherein the bandpass load is configured to filter an out-of-band signal in the radio receive path;
    a transmit path down-converting mixer including:
    a first mixer input coupled with an RF signal transmit path and a second mixer input coupled with a local oscillator; and
    a receive path cancelation module including:
    a first cancelation module input coupled with a cancelation signal based on an output of the transmit path down-converting mixer;
    a second cancelation module input coupled with a receive path down-converting mixer output; and
    a third cancelation module input configured for receiving an active antenna system intermodulation signal;
    wherein the cancelation module includes a receive path signal output coupled to a baseband receive module.

13. The radio system of claim 12, wherein the transmit path down-converting mixer and the cancelation module operate in the digital domain.

14. The radio system of claim 13, comprising:
    a digital pre-distortion module included in a baseband transmit module and coupled with the output of the transmit path down-converting mixer.

15. The radio system of claim 12, further comprising:
a re-modulator including:
an input coupled with a demodulated and error-corrected signal output from the baseband receive module and
an output coupled with a third cancelation module input;
wherein the cancelation module includes a fourth cancelation module input coupled with a baseband or intermediate frequency transmit signal output of the transmit path.

16. The radio system of claim 12, wherein the transmit path down-converting mixer includes a band-stop or bandpass mixer.

\* \* \* \* \*